United States Patent
Kimura

(10) Patent No.: US 7,944,127 B2
(45) Date of Patent: May 17, 2011

(54) PIEZOELECTRIC CERAMIC COMPOSITION AND PIEZOELECTRIC PART

(75) Inventor: Masahiko Kimura, Kusatsu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 74 days.

(21) Appl. No.: 12/608,628

(22) Filed: Oct. 29, 2009

(65) Prior Publication Data

US 2010/0038999 A1    Feb. 18, 2010

Related U.S. Application Data

(63) Continuation of application No. PCT/JP2008/057329, filed on Apr. 15, 2008.

(30) Foreign Application Priority Data

May 14, 2007    (JP) .............................. 2007-128003

(51) Int. Cl.
    *H01L 41/187*    (2006.01)
(52) U.S. Cl. ...................................... 310/358
(58) Field of Classification Search ................. 310/358; 252/62.9 R, 62.9 PZ
    See application file for complete search history.

(56) References Cited

U.S. PATENT DOCUMENTS

| 3,463,732 A * | 8/1969 | Banno et al. .......... 252/62.9 PZ |
| 2001/0012815 A1 | 8/2001 | Nakamichi et al. |
| 2007/0046734 A1 | 3/2007 | Aoki et al. |

FOREIGN PATENT DOCUMENTS

| JP | S57-047768 A | | 3/1982 |
| JP | H05-012975 A | | 1/1993 |
| JP | H05-017214 A | | 1/1993 |
| JP | 07-045882 | * | 2/1995 |
| JP | 2001-287986 A | | 10/2001 |
| JP | 2003-165770 A | | 6/2003 |
| JP | 2004-051438 | * | 2/2004 |
| JP | 2004-107141 A | | 4/2004 |
| JP | 2005-145770 A | | 6/2005 |
| JP | 2007-088444 A | | 4/2007 |

OTHER PUBLICATIONS

Machine translation of JP 07-045882 generated from the website of the Japanese Patent Office.*
Machine translation of JP 2004-051438 generated from the website of the Japanese Patent Office.*
PCT International Search Report and Written Opinion of the International Searching Authority, mailed May 5, 2008 (Japanese).

* cited by examiner

Primary Examiner — Derek J Rosenau
(74) Attorney, Agent, or Firm — Dickstein Shapiro LLP

(57) ABSTRACT

A piezoelectric ceramic composition contains main components represented by a general formula of $[(Pb_{1-x-y}Ca_xSr_y)\{Ti_{1-z}(Zn_{1/2}W_{1/2})_z\}O_3]$, and x, y, and z satisfy $0 \leq x \leq 0.2$ (preferably $0 \leq x \leq 0.15$), $0 \leq y \leq 0.2$ (preferably $0 \leq y \leq 0.1$), $0.1 \leq x+y \leq 0.2$, and $0.04 \leq z \leq 0.1$. It is also preferable that the piezoelectric ceramic composition contains 0.05 weight part to 1.0 weight part of a Mn component calculated in terms of $MnCO_3$ with respect to 100 weight parts of the main component. A piezoelectric part includes a piezoelectric ceramic element that is formed by the piezoelectric ceramic composition. It is thereby possible to realize a piezoelectric ceramic composition that can be fired at low temperature, that has a high Curie point Tc resistant to a reflow heating treatment on a lead-free solder, and that exhibits satisfactory piezoelectricity, and a piezoelectric part using this piezoelectric ceramic composition.

19 Claims, 1 Drawing Sheet

PIEZOELECTRIC CERAMIC COMPOSITION AND PIEZOELECTRIC PART

This is a continuation of application Serial No. PCT/JP2008/027329, filed Apr. 15, 2009, which is incorporated herein by reference.

TECHNICAL FIELD

The present invention relates to a piezoelectric ceramic composition and a piezoelectric part. More specifically, the present invention relates to a lead titanate-based piezoelectric ceramic composition that can be low-temperature fired and a piezoelectric part using the same.

BACKGROUND ART

Lead titanate ($PbTiO_3$) having a perovskite structure (general formula $ABO_3$) is ferroelectric and suited as a piezoelectric material because of its exhibition of piezoelectricity. It has a small number of pores and it is difficult to obtain strong ceramic using this lead titanate. Research and development of a method to obtain a dense piezoelectric ceramic composition by substituting an element such as Ca, Sr, Zn or W for a part of Pb or Ti or by adding various types of components to the lead titanate was undertaken, and practicable application of the piezoelectric ceramic composition to a piezoelectric part such as a piezoelectric ceramic oscillator is being made.

If the piezoelectric part is a stacked type, it is efficient to manufacture the piezoelectric part by alternately stacking ceramic layers and conductive layers and collectively firing these conductive and ceramic layers.

Furthermore, expensive refractory noble metals such as Pt or Pd were initially used as an internal electrode material forming each conductive layer. Recently, however, a conductive material obtained by mixing a relatively inexpensive metal such as Ag to such expensive noble metals or an Ag—Pd alloy conductive material has been investigated.

As the internal electrode material, it is preferable to use a metal industrially available at low cost or to use a mixture or an alloy containing many low-cost metals. However, the low-cost metals normally have a low melting point. Due to this, it is necessary to make the firing temperature low if such a low-melting metal is used as the internal electrode material and the conductive layers and the ceramic layers are collectively fired. In other words, if a lead titanate-based ceramic material having a lower firing temperature can be obtained, a low-cost metal or metals can be used as the internal electrode material and the manufacturing cost of the piezoelectric part can be reduced accordingly.

As a technique for low-temperature firing a lead titanate-based piezoelectric material, there is conventional proposed a piezoelectric ceramic composition main components of which are represented by a general formula $Pb_a(Co_{\alpha/2}W_{(2-\alpha/2)})_bTi_{1-b}O_3$ with a, b, and $\alpha$ satisfying $0.90 \leq a \leq 1.05$, $0.01 \leq b \leq 0.33$, and $1.01 \leq \alpha \leq 1.10$ (Patent Document 1).

According to Patent Document 1, a piezoelectric ceramic composition that can be fired at a low temperature equal to or lower than 1000° C. and that can provide a sintered compact having less deformation during firing can be obtained by setting a, b and $\alpha$ in the general formula to fall within these predetermined ranges, respectively.

As another technique for low-temperature firing a lead titanate-based ceramic material, there is proposed a composition represented by a general formula $[(Pb_aMe_b)\{(Ni_{1/3}Nb_{2/3})_xTi_y(Zn_{1/2}W_{1/2})_z\}O_{2+a+b}]$ (where x+y+z=1, Me is at least one member selected from among the group consisting of Ca, Sr and Ba), although this composition is a dielectric ceramic composition (Patent Document 2).

According to Patent Document 2, a high-dielectric-constant dielectric ceramic composition that can be fired at a low temperature equal to or lower than 1100° C. can be obtained by setting a, b, x, y and z in the general formula to fall within predetermined ranges, respectively.

Patent Document 1: Japanese Unexamined Patent Publication No. 2003-165770
Patent Document 2: Japanese Examined Patent Publication No. 7-12975

DISCLOSURE OF THE INVENTION

Problems to be Solved by the Invention

Meanwhile, it is prevailing practice to mount a piezoelectric part on a board by performing a solder reflow heating treatment. In recent years, a demand for changing from lead solder to a lead-free solder has arisen from environmental and other viewpoints. However, the melting temperature of the lead-free solder is normally higher than that of the lead-containing solder. This requires a piezoelectric part obtained using the lead-free solder to have higher heat resistance. If the temperature exceeds the Curie point Tc, polarization of the piezoelectric part vanishes and the piezoelectric part does not exhibit piezoelectricity. Due to this, the Curie point Tc of the piezoelectric part is required to be high enough to resist a reflow heating treatment on the lead-free solder.

The Curie points Tc of most of the compositions described in Patent Document 1 are around 200° C. (Table 2 in Patent Document 1). Due to this, each of these compositions possibly cannot resist a reflow heating treatment of the lead-free solder.

Furthermore, each of the compositions described in Patent Document 1 contains Co, a scarce metal, as an essential constituent element and, therefore, it is possibly difficult to reliably acquire ceramic raw material.

The composition described in Patent Document 2 can be fired at the low temperature but the ceramic composition is developed for use as a dielectric. Due to this, the mixture molar ratio of Ti in B site is as low as 0.7 or lower. As a result, satisfactory piezoelectric properties cannot be obtained and it is difficult to secure the desired piezoelectricity even if the composition is applied to a piezoelectric part. Besides, since the composition is used as the dielectric, the Curie point Tc of the composition is as low as around room temperature. As a result, even if the composition described in Patent Document 2 is used, it is by no means possible to attain a piezoelectric part that can resist the reflow heating treatment.

The present invention has been made under these circumstances. It is one of the objects of the present invention to provide a piezoelectric ceramic composition that can be fired at low temperature, that has a high Curie point Tc resistant to a reflow heating treatment of a lead-free solder, and that exhibits satisfactory piezoelectricity, and to provide a piezoelectric part using the same.

Means for Solving the Problems

A piezoelectric ceramic composition including a main component represented by a general formula of $[(Pb_{1-x-y}Ca_xSr_y)\{Ti_{1-z}(Zn_{1/2}W_{1/2})_z\}O_3]$, wherein x, y, and z satisfy $0 \leq x \leq 0.2$, $0 \leq y \leq 0.2$, $0.1 \leq x+y \leq 0.2$, and $0.04 \leq z \leq 0.1$ is provided herein.

In this piezoelectric ceramic composition, x and y satisfy $0 \leq x \leq 0.15$, $0 \leq y \leq 0.1$, and $0.1 \leq x+y \leq 0.2$.

The piezoelectric ceramic composition contains an Mn component in an amount of by 0.05 weight part to 1.0 weight part in terms of $MnCO_3$ with respect to 100 weight parts of the main components.

Provided is a piezoelectric part having an internal electrode buried in a piezoelectric ceramic element and an external electrode formed on a surface of the piezoelectric ceramic element, wherein the piezoelectric ceramic element is formed by a piezoelectric ceramic composition described above.

Effect of the Invention

The main composition of the piezoelectric composition stated above is represented by the general formula of $[(Pb_{1-x-y}Ca_xSr_y)\{Ti_{1-z}(Zn_{1/2}W_{1/2})_z\}O_3]$, where x, y, and z satisfy $0 \leq x \leq 0.2$ (preferably $0 \leq x \leq 0.15$), $0 \leq y \leq 0.2$ (preferably $0 \leq y \leq 0.1$), $0.1 \leq x+y \leq 0.2$, and $0.04 \leq z \leq 0.1$. Therefore, it is possible to fire the piezoelectric ceramic composition at low temperature equal to or lower than 1100° C., to have a high Curie point equal to or higher than 300° C. and thereby realize resistance to a reflow heating treatment using a lead-free solder, and to obtain satisfactory piezoelectricity.

Since the piezoelectric ceramic composition can be fired at the low temperature equal to or lower than 1100° C., there is no need to use a high-melting noble metal such as Pd or Pt as an internal electrode material but a conductive material having a relatively low melting point such as a Ag—Pd alloy mainly containing Ag can be used. In other words, it is possible to obtain a dense piezoelectric ceramic even if the composition is fired at the low temperature equal to or lower than 1100° C. and reduce manufacturing cost.

Moreover, since a high Curie point Tc equal to or higher than 300° C. can be secured, the piezoelectric ceramic composition can resist the lead-free solder reflow heating treatment and a piezoelectric part suitable for such a reflow heating treatment can be realized.

The piezoelectric part using this piezoelectric ceramic composition can secure satisfactory piezoelectricity, including an electromechanical coupling factor kp equal to or higher than 15% and a mechanical quality factor Qm equal to or higher than 60. As for the temperature characteristics of resonance frequency, an absolute value |frTC| of a temperature rate of change based on +20° C. (hereinafter, simply referred to as the "temperature rate of change |frTc|") in a temperature range from −20° C. to +80° C. can be suppressed to be equal to or lower than 80 ppm/° C. It is, therefore, possible to secure satisfactory temperature characteristics.

The piezoelectric ceramic composition contains the Mn component in an amount of 0.05 weight part to 1.0 weight part calculated in terms of $MnCO_3$ with respect to 100 weight parts of the main component. It is thereby possible to greatly improve the mechanical quality factor Qm in addition to the above-stated advantages effects.

DESCRIPTION OF REFERENCE SYMBOLS

Figure 1:
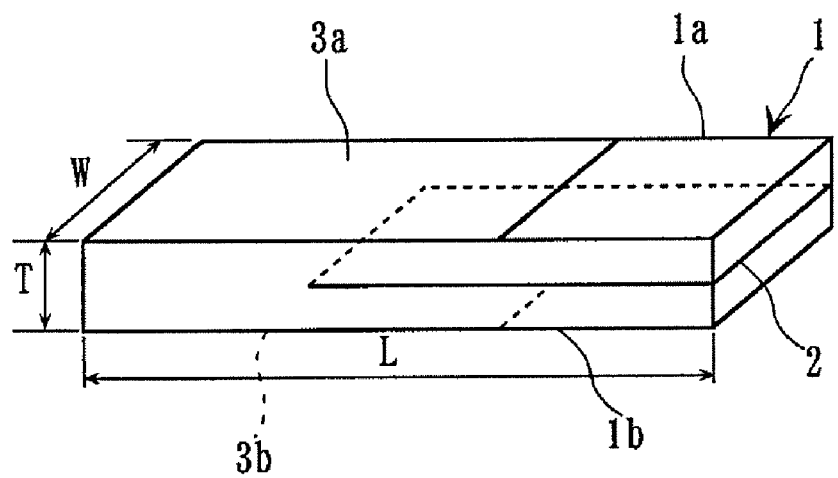
FIG. 1 is a perspective view showing a piezoelectric oscillator serving as a piezoelectric element according to one embodiment of the present invention.

1 Piezoelectric ceramic element
2 Internal electrode
3a, 3b External electrode

BEST MODES FOR CARRYING OUT THE INVENTION

Embodiments of the present invention will be described hereinafter in detail.

A piezoelectric ceramic composition according to one embodiment of the present invention includes a main component represented by a general formula (A).

$$[(Pb_{1-x-y}Ca_xSr_y)\{Ti_{1-z}(Zn_{1/2}W_{1/2})_z\}O_3] \quad (A)$$

The molar amounts x, y, z satisfy the following numerical expressions (1) to (4).

$$0 \leq x \leq 0.2 \quad (1)$$

$$0 \leq y \leq 0.2 \quad (2)$$

$$0.1 \leq x+y \leq 0.2 \quad (3)$$

$$0.04 \leq z \leq 0.1 \quad (4)$$

The electromagnetic composition according to this embodiment contains a $PbTiO_3$-based compound oxide having the perovskite structure (general formula: $ABO_3$) as a main component. At least one of Ca and Sr is substituted for a part of the Pb which is an A site component, and $(Zn_{1/2}W_{1/2})$ is substituted for a part of the Ti which is a B site component.

As stated above, the general formula (A) satisfies the numerical expressions (1) to (4), whereby it is possible to obtain a piezoelectric ceramic composition that can be fired at a low temperature equal to or lower than 1100° C., that has a high Curie point equal to or higher than 300° C., is resistant to a solder reflow heating treatment, and that exhibits satisfactory piezoelectricity.

The reasons for limiting the mixture molar amounts x, y, and z as the main component composition to the ranges represented by the numerical expressions (1) to (4) will be described.

(1) Mixture Molar Amounts x and y

At least one of Ca and Sr is substituted for a part of Pb in the A site, and there is $(Zn_{1/2}W_{1/2})$ in the B site, making it possible to obtain a piezoelectric ceramic component that can be fired at a low temperature equal to or lower than 1100° C., that has a high Curie point Tc equal to or higher than 300° C., and that exhibits satisfactory piezoelectricity.

If each of the mixture molar amounts x of Ca or y of Sr and the sum of the molar amount of the both of Ca and Sr (hereinafter, referred to as a "total mixture molar amount") (x+y) exceeds 0.2, then the Curie point Tc of the piezoelectric ceramic component possibly decreases and the piezoelectric ceramic component possibly cannot resist a reflow heating treatment using a lead-free solder. That is, as described above, if a piezoelectric part is mounted on a board by performing a reflow heating treatment on the lead-free solder, the Curie temperature Tc needs to be high enough to be able to resist the reflow heating treatment so as to secure the functions as the piezoelectric part. However, if each of the molar amount x of Ca or the mixture molar amount y of Sr and the total molar amount (x+y) exceeds 0.2, then the Curie point Tc of the piezoelectric ceramic component possibly decreases to 300° C. or lower and the piezoelectric ceramic component possibly cannot resist a reflow heating treatment on the lead-free solder. In addition, this possibly causes deterioration in temperature characteristics of resonance frequency.

On the other hand, if the total molar amount (x+y) is lower than 0.1 even with Ca or Sr contained in the A site, the degree of sintering decreases and it is difficult to fire the piezoelectric ceramic composition at a low temperature equal to or lower than 1100° C. because of low contents of Ca and/or Sr.

Therefore, mixture amounts of the constituent compositions in this embodiment, of the A site are prepared so that the each of the molar amount x of Ca or the molar amount y of Sr in the A site and the total molar amount (x+y) satisfies $0 \leq x \leq 0.2$, $0 \leq y \leq 0.2$, and $0.1 \leq x+y \leq 0.2$, preferably $0 \leq x \leq 0.15$, $0 \leq y \leq 0.1$, and $0.1 \leq x+y \leq 0.2$.

(2) Mixture Molar Amount z $(Zn_{1/2}W_{1/2})$ is substituted for a part of Ti in the B site, in addition to the Ca and Sr, making it possible to obtain a piezoelectric ceramic component that can be fired at a low temperature equal to or lower than 1100° C., that has the high Curie point Tc equal to or higher than 300° C., and that exhibits satisfactory piezoelectricity.

However, if the mixture molar amount z of $(Zn_{1/2}W_{1/2})$ exceeds 0.1, then the Curie point Tc of the piezoelectric ceramic component possibly decreases and the piezoelectric ceramic component possibly cannot resist the reflow heating treatment of the lead-free solder.

On the other hand, if the mixture molar amount z of $(Zn_{1/2}W_{1/2})$ is lower than 0.04, the mixture amount of $(Zn_{1/2}W_{1/2})$ is too small. As a result, if the piezoelectric ceramic component is fired at the low temperature of 1100° C., the insulation resistance of the piezoelectric ceramic component decreases to make it difficult to carry out a polarization treatment.

Therefore, mixture amounts of the constituent compositions in this embodiment of the B site are prepared so that the molar amount z of $(Zn_{1/2}W_{1/2})$ satisfies $0.04 \leq z \leq 0.1$.

A piezoelectric part manufactured using the piezoelectric ceramic composition will next be described.

Figure 2:
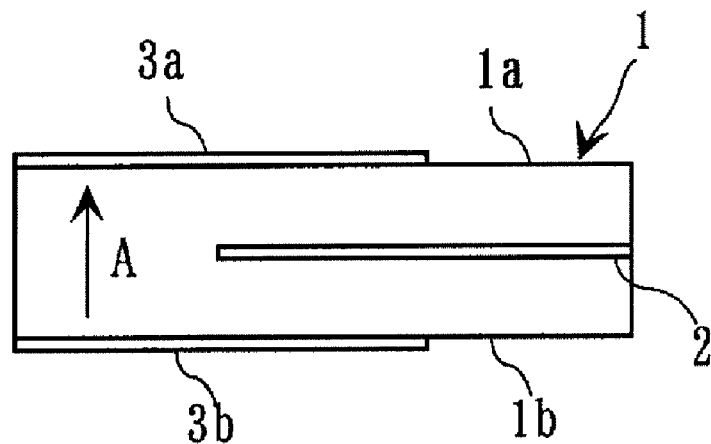
FIG. 2 is a longitudinal sectional view of FIG. 1.

FIG. 1 is a perspective view of a piezoelectric oscillator serving as the piezoelectric part according to the embodiment of the present invention. FIG. 2 is a longitudinal sectional view of FIG. 1.

In FIGS. 1 and 2, the piezoelectric oscillator is configured so that an internal electrode 2 is buried in a piezoelectric ceramic element 1 and so that external electrodes 3a and 3b are formed on surfaces of the piezoelectric ceramic element 1. Specifically, the piezoelectric ceramic element 1 is configured so that two piezoelectric ceramics 1a and 1b each formed into a rectangular parallelepiped (length: L, width: W) are stacked with each other via the internal electrode 2 and integrated with each other. Further, the piezoelectric ceramic element is formed so as to be polarized in the direction of arrow A and to have a thickness T.

The internal electrode 2 is formed to cover up a majority of a surface of the piezoelectric ceramic element 1b and to have a terminal end surface exposed to one side surface of the piezoelectric oscillator.

The external electrodes 3a and 3b are formed on external surfaces of the piezoelectric ceramics 1a and 1b, respectively, to be opposed to each other. Specifically, the external electrodes 3a and 3b are formed so that the external electrodes 3a and 3b are partially opposed to the internal electrode 2 via the piezoelectric ceramic 1a or 1b, that the external electrodes 3a and 3b cover a majority of the surface of the piezoelectric ceramic 1a or 1b, and that each of the external electrodes 3a and 3b has, as a terminal end, a terminal edge opposite a direction to a terminal end of the internal electrode 2.

A method of manufacturing the piezoelectric oscillator will next be described.

First, as ceramic raw materials, a Pb compound containing Pb, a Ca compound containing Ca, an Sr compound containing Sr, a Ti compound containing Ti, a Zn compound containing Zn, and a W compound containing W are prepared.

The ceramic raw materials are weighed so that the general formula (A) satisfies the numerical expressions (1) to (4). These weighed materials are put into a ball mill containing a milling medium such as partially-stabilized zirconia, and sufficiently wet blended using pure water, ethanol or the like as a solvent, thereby producing slurry. In this case, it is also preferable to add dispersant such as sorbitan ester so as to create a more uniform blending state.

After drying this slurry, it is calcined at a temperature of 800° C. to 1100° C. under oxidizing atmosphere, thereby obtaining a calcined compact. After shredding this calcined compact, an organic binder such as polyvinyl alcohol resin is added to the shredded calcined compact, and the binder-added calcined compact is put again into the ball mill containing the milling medium and sufficiently wet milled, thereby producing a second slurry.

A molding method such as a doctor blade method is executed to this second slurry, thereby producing ceramic green sheets.

A conductive paste containing a conductive material such as Ag—Pd is prepared. The conductive paste is applied onto a part of the ceramic green sheets to form a conductive layer. Thereafter, a ceramic green sheet on which a conductive layer is not formed is mounted on an upper surface of the ceramic green sheet on which the conductive layer is formed, and the ceramic green sheets are bonded, e.g., pressure bonded, thereby producing a ceramic compact.

This ceramic compact is fired at the low temperature equal to or lower than 1100° C., thereby producing a ceramic sintered compact.

Polarization treatment electrodes on both principal surfaces, respectively, are formed by sputtering using Ag as a target. Next, a predetermined DC voltage applied onto both principal surfaces in insulating oil at 150° C. to polarize the surfaces. Thereafter, the polarization treatment electrodes are etched away, thereby obtaining the piezoelectric ceramic element 1 in which the internal electrode 2 is buried.

Thereafter, the piezoelectric ceramic element 1 is appropriately cut so that the internal electrode 2 is arranged at a predetermined position and sputtering again using Ag as a target to form the external electrodes 3a and 3b on the both principal surfaces of the piezoelectric ceramic element 1, respectively, and subsequently manufacturing the piezoelectric oscillator.

The piezoelectric oscillator manufactured as stated above can be fired at a low temperature equal to or lower than 1100° C. since the piezoelectric ceramic element 1 (piezoelectric ceramics 1a and 1b) is made of the above-stated piezoelectric ceramic composition. Therefore, a low-melting metal such as Ag—Pd can be used in the piezoelectric oscillator and the piezoelectric oscillator can be manufactured at low cost. Also, the piezoelectric oscillator thus manufactured can secure a high Curie point Tc equal to or higher than 300° C. and can resist a reflow heating treatment on a lead-free solder. Further, the piezoelectric oscillator can ensure satisfactory piezoelectricity including an electromechanical coupling factor kp equal to or higher than 15% and a mechanical quality factor Qm equal to or higher than 60. As for the temperature characteristics of resonance frequency, a temperature rate of change |frTC| based on +20° C. in a temperature range from −20° C. to +80° C. can be suppressed to be equal to or lower than 80 ppm/° C. It is, therefore, possible to secure satisfactory temperature characteristics.

As long as the general formula (A) satisfies the numerical expressions (1) to (4), additive components of any type can be contained in the piezoelectric ceramic composition. For example, it is preferable to add Mn to the main components with the view of further improving the mechanical quality factor Qm.

In this case, however, the content of Mn is preferably 0.05 weight part to 1.0 weight part calculated in terms of $MnCO_3$ with respect to 100 weight parts of the principal component.

In other words, to further improve the mechanical quality factor Qm by adding Mn, it is effective to contain at least 0.05 weight part of Mn in terms of $MnCO_3$ with respect to 100 weight parts of the main component in the piezoelectric ceramic composition. However, if the piezoelectric ceramic composition contains Mn whose weight part exceeds 1.0 weight part in terms of $MnCO_3$ with respect to 100 weight parts of the main component, the mechanical quality factor Qm possibly deteriorates.

Therefore, to further improve the mechanical quality factor Qm, it is preferable to add Mn to the main components but, even in that case, it is preferable to control the Mn content to 0.05 weight part to 1.0 weight part in terms of $MnCO_3$ with respect to 100 weight parts of the main component.

Even if Mn is added to the main components, the piezoelectric oscillator can be manufactured by a similar method to that described above except that an Mn compound is weighed and blended as well as the above-stated compounds as the ceramic raw material.

The present invention is not limited to the embodiment stated above. Specific forms of the ceramic raw materials such as the Pb compound, the Ca compound, the Sr compound, the Ti compound, the Zn compound, and the W compound may be carbonates, hydroxides or oxides.

Furthermore, the piezoelectric ceramics in the embodiment stated above, $1a$ and $1b$ were produced by a so-called sheet method. Alternatively, the piezoelectric ceramics $1a$ and $1b$ may be produced by press working.

Moreover, the piezoelectric part in the embodiment stated above has been described taking the piezoelectric oscillator as an example. The same thing is true for a piezoelectric actuator, a piezoelectric filter, a piezoelectric buzzer and a piezoelectric sensor.

Examples of the present invention will be described specifically.

EXAMPLE 1

As ceramic raw materials, $Pb_3O_4$, $CaCO_3$, $SrCO_3$, $TiO_2$, ZnO, and $WO_6$ were prepared.

The ceramic raw materials were weighed so as to obtain component composition of a final composition as shown in Table 1. Next, these weighed materials were put into the ball mill containing partially-stabilized zirconia, and sufficiently wet blended for about 16 hours using pure water as a solvent, thereby producing a slurry.

After drying this slurry, it is calcined at a temperature of 900° C. under oxidizing atmosphere, thereby obtaining a calcined compact. After shredding (grinding) the calcined compact, polyvinyl alcohol resin serving as an organic binder was added to the shredded calcined compact, and the binder-added calcined compact were put again into the ball mill containing partially-stabilized zirconia and wet milled for about 16 hours, thereby producing a second slurry. The second slurry was formed into sheets by the doctor blade method, thereby producing ceramic green sheets.

A conductive paste regulated so that the content ratio of Ag to Pd was 7:3 by weight was prepared. The conductive paste was applied onto a part of a ceramic green sheet to form a conductive layer. Thereafter, a ceramic green sheet on which a conductive layer is not formed was mounted on the upper surface of the ceramic green sheet on which the conductive layer is formed, and the ceramic green sheets were bonded, thereby producing a ceramic compact. This ceramic compact was fired at a temperature from 1100° C. to 1200° C., thereby producing a ceramic sintered compact.

Both principal surfaces of this ceramic sintered compact were sputtered using Ag as a target, thereby forming Ag polarization treatment electrodes on the both principal surfaces, respectively. A DC voltage of 5 kV/mm was applied for 60 minutes onto the both principal surfaces in insulating oil at 150° C. to polarize the surfaces. Thereafter, the polarization treatment electrodes were etched away, thereby obtaining a piezoelectric ceramic element.

Next, the piezoelectric ceramic element was cut to appropriately have a length L of 5 mm, a width W of 1 mm, and a thickness T of 0.4 mm, with the internal electrode arranged at a predetermined position and sputtered again using Ag as a target, thereby forming Ag external electrodes on the both principal surfaces of the piezoelectric ceramic element. Eventually, samples 1 to 22 were produced.

Next, the sintered density, electromechanical coupling factor kp by thickness longitudinal oscillation, mechanical quality factor Qm, Curie point Tc, and temperature rate of change |frTC| of resonance frequency of each of the samples 1 to 22 were measured.

In this case, the sintered density was measured by the Archimedes' method.

The resonance frequency fr and antiresonance frequency fa were measured by the resonance-antiresonance method using RF Impedance Analyzer (manufactured by Hewlett-Packard Development Company, HP4194A) and measured values were obtained. The electromechanical coupling factor kp and the mechanical quality factor Qm were calculated from the measured values.

The temperature characteristics of the electromechanical coupling factor kp were measured. A temperature at which the electromechanical coupling factor kp reached zero as temperature rises, that is, the temperature at which piezoelectricity vanishes was measured, thereby obtaining the Curie point Tc.

The temperature rate of change |frTC| of the resonance frequency was calculated by measuring the resonance frequency fr in a range from −20° C. to +80° C. and calculating a maximum rate of change relative to on +20° C.

The Table 1 below shows constituent components and firing temperatures of the samples 1 to 22, and Table 2 shows measurement results of the samples 1 to 22.

TABLE 1

| Sample No. | $(Pb_{1-x-y}Ca_xSr_y)\{Ti_{1-z}(Zn_{1/2}W_{1/2})_z\}O_3$ | | | | Firing temperature (° C.) |
|---|---|---|---|---|---|
| | X | y | x + y | Z | |
| 1* | 0 | 0 | 0 | 0 | 1100 |
| 2* | 0 | 0 | 0 | 0.05 | 1100 |
| 3* | 0.05 | 0 | 0.05 | 0.05 | 1100 |
| 4 | 0.1 | 0 | 0.1 | 0.05 | 1100 |
| 5 | 0.15 | 0 | 0.15 | 0.05 | 1100 |
| 6 | 0.2 | 0 | 0.2 | 0.05 | 1100 |
| 7* | 0.22 | 0 | 0.22 | 0.05 | 1100 |
| 8* | 0 | 0.05 | 0.05 | 0.05 | 1100 |
| 9 | 0 | 0.1 | 0.1 | 0.05 | 1100 |
| 10 | 0 | 0.15 | 0.15 | 0.05 | 1100 |
| 11 | 0 | 0.2 | 0.2 | 0.05 | 1100 |
| 12* | 0 | 0.22 | 0.22 | 0.05 | 1100 |
| 13* | 0.02 | 0.02 | 0.04 | 0.05 | 1100 |
| 14 | 0.05 | 0.05 | 0.10 | 0.05 | 1100 |
| 15 | 0.1 | 0.1 | 0.2 | 0.05 | 1100 |
| 16* | 0.15 | 0.15 | 0.30 | 0.05 | 1100 |
| 17* | 0.1 | 0.1 | 0.2 | 0.03 | 1100 |
| 18* | 0.1 | 0.1 | 0.2 | 0.03 | 1150 |
| 19* | 0.1 | 0.1 | 0.2 | 0.03 | 1200 |
| 20 | 0.1 | 0.1 | 0.2 | 0.04 | 1100 |
| 21 | 0.1 | 0.1 | 0.2 | 0.1 | 1100 |
| 22* | 0.1 | 0.1 | 0.2 | 0.15 | 1100 |

*indicates out of range of the present invention

TABLE 2

| Sample No. | Sintered density (g/cm³) | Electro-mechanical coupling factor kp (%) | Mechanical quality factor Qm (—) | Curie point Tc (° C.) | Temperature rate of change |frTC| of resonance frequency (ppm/° C.) |
|---|---|---|---|---|---|
| 1* | Non-measurable (sample collapsed) | | | | |
| 2* | Non-measurable (sample collapsed) | | | | |
| 3* | Non-measurable (sample collapsed) | | | | |
| 4 | 6.8 | 34 | 66 | 370 | 40 |
| 5 | 6.9 | 44 | 85 | 340 | 20 |
| 6 | 6.9 | 46 | 77 | 300 | 58 |
| 7* | 6.8 | 47 | 120 | 260 | 102 |
| 8* | Non-measurable (sample collapsed) | | | | |
| 9 | 6.8 | 34 | 74 | 370 | 75 |
| 10 | 6.8 | 40 | 66 | 335 | 70 |
| 11 | 6.8 | 40 | 60 | 300 | 74 |
| 12* | 6.6 | 47 | 60 | 260 | 77 |
| 13* | Non-measurable (sample collapsed) | | | | |
| 14 | 6.7 | 34 | 65 | 370 | 50 |
| 15 | 6.8 | 46 | 78 | 310 | 38 |
| 16* | 6.6 | 40 | 37 | 235 | 68 |
| 17* | 5.2 | Non-measurable (non-polarizable) | | | |
| 18* | 6.5 | 10 | 105 | 310 | 35 |
| 19* | 6.8 | 41 | 73 | 310 | 30 |
| 20 | 6.8 | 44 | 94 | 310 | 37 |
| 21 | 6.7 | 48 | 115 | 305 | 40 |
| 22* | 6.4 | 42 | 75 | 250 | 44 |

*indicates out of range of the present invention

In case of the sample 1, the piezoelectric composition was constituted by PbTiO₃. Due to this, a sintered compact could not be obtained when the composition was fired at the low temperature of 1100° C., and the sample collapsed.

Each of the samples 2 to 16 was prepared so that the mixture molar amount z of $(Zn_{1/2}W_{1/2})$ in the B site was equal to 0.05.

Among the samples 2 to 16, the samples 2 to 7 did not contain Sr in the A site.

Sample 2 contained neither Sr nor Ca in the A site and contained only Pb. Due to this, similarly to the sample 1, a sintered compact could not be obtained when the composition was fired at the low temperature of 1100° C., and the sample collapsed.

As for the sample 3, the mixture molar amount x of Ca was 0.05 but the sample 3 did not contain Sr and the total mixture amount (x+y) of the sample 3 was, therefore, 0.05. Due to this, similarly to the samples 1 and 2, a sintered compact could not be obtained when the composition was fired at the low temperature of 1100° C., and the sample collapsed.

As for the sample 7, the mixture molar amount x of Ca was excessively 0.22 and the Curie point Tc was 260° C., a value lower than 300° C. Due to this, the sample 7 possibly could not resist a reflow heating treatment to be performed on the lead-free solder. Besides, it was clear in this case that the temperature rate of change |frTc| of the resonance frequency was 102 ppm/° C. a value exceeding 80 ppm/° C., resulting in deterioration in the temperature characteristics.

In samples 4 to 6, Sr was not in the A site. However, the mixture molar amount x of Ca was 0.1 to 0.2, and the total mixture molar amount (x+y) was, therefore, 0.1 to 0.2, which ratio falls within the scope of the present invention. As a result, the Curie point Tc was 300° C. to 370° C. and each of the samples 4 to 6 could secure a Curie point Tc equal to or higher than 300° C. and resist the reflow heating treatment on the lead-free solder. Furthermore, the temperature rate of change |frTc| of the resonance frequency was 20 to 58 ppm/° C. and was, therefore, suppressed to be equal to or lower than 80 ppm/° C. Each of the samples 4 to 6 could secure satisfactory temperature characteristics. The electromechanical coupling factor kp was 34% to 46% and each of the samples 4 to 6 could secure an electromechanical coupling factor kp equal to or higher than 15%. Moreover, the mechanical quality factor Qm was 66 to 85 and each of the samples 4 to 6 could secure a mechanical quality factor Qm equal to or higher than 60. In other words, it was confirmed that the samples 4 to 6 were practicable even in terms of the piezoelectricity.

For samples 4 and 5, in which satisfied were the molar amounts x of $0 \leq x \leq 0.15$ and $0 \leq y \leq 0.1$, in particular, the temperature rate of change |frTC| could be suppressed to be equal to or lower than 40 ppm/° C. It was, therefore, clear that the samples 4 and 5 could exhibit more satisfactory temperature characteristics.

Samples 8 to 12 did not contain Ca in the A site.

In sample 8, the mixture molar amount x of Sr was 0.05 but the sample 8 did not contain Ca and the total mixture amount (x+y) of the sample 8 was, therefore, 0.05. Due to this, similarly to the sample 2, a sintered compact could not be obtained when the composition was fired at the low temperature of 1100° C., and the sample collapsed.

In sample 12, the mixture molar amount x of Sr was excessively 0.22 and the Curie point Tc was 260° C., a value lower than 300° C. Due to this, the sample 12 possibly could not resist a reflow heating treatment to be performed on the lead-free solder.

Ca was not in the A site of samples 9 to 11. However, the mixture molar amount x of Sr was 0.1 to 0.2, and the total mixture molar amount (x+y) was, therefore, 0.1 to 0.2, which ratio falls within the scope of the present invention. As a result, the Curie point Tc was 300° C. to 370° C. and each of the samples 9 to 11 could secure the Curie point Tc equal to or higher than 300° C. and resist a reflow heating treatment on the lead-free solder. Furthermore, the temperature rate of change |frTc| of the resonance frequency was 70 to 75 ppm/° C. and was, therefore, suppressed to be equal to or lower than 80 ppm/° C. Each of the samples 9 to 11 could secure satisfactory temperature characteristics. Besides, the electromechanical coupling factor kp was 34% to 40% and each of the samples 9 to 11 could secure an electromechanical coupling factor kp equal to or higher than 15%. Moreover, the mechanical quality factor Qm was 60 to 74 and each of the samples 9 to 11 could secure a mechanical quality factor Qm equal to or higher than 60. In other words, it was confirmed that the samples 9 to 11 were practicable even in terms of piezoelectricity.

Samples 13 to 16 contained both Ca and Sr as A site components.

In sample 13, the mixture molar amount x of Ca was 0.02, the mixture molar amount y of Sr was 0.02, and total mixture amount (x+y) of the sample 13 was, therefore, 0.04. Due to this, a sintered compact could not be obtained when the composition was fired at the low temperature of 1100° C., and the sample collapsed.

As for sample 16, the mixture molar amount x of Ca was 0.15, the mixture molar amount y of Sr was 0.15, but the total mixture molar amount (x+y) was excessively 0.3. As a result, the Curie point Tc was 235° C., a value lower than 300° C. Due to this, the sample 16 possibly could not resist a reflow heating treatment to be performed on the lead-free solder. Besides, in this case, the mechanical quality factor Qm was 37 equal to or lower than 60.

For samples 14 and 15, each of the mixture molar amount x of Ca and the mixture molar amount y of Sr was 0.05 to 0.1, and the total mixture molar amount (x+y) was 0.1 to 0.2, which ratio falls within the scope of the present invention. As a result, it was clear that the Curie point Tc was 310° C. to 370° C. and each of the samples 14 and 15 could secure the Curie point Tc equal to or higher than 300° C. and resist a reflow heating treatment on lead-free solder. Furthermore, the temperature rate of change |frTc| of the resonance frequency was 38 to 50 ppm/° C. and was, therefore, suppressed to be equal to or lower than 80 ppm/° C. Each of the samples 14 and 15 could secure satisfactory temperature characteristics. Besides, the electromechanical coupling factor kp was 34% to 46% and each of the samples 14 and 15 could secure the electromechanical coupling factor kp equal to or higher than 15%. Moreover, the mechanical quality factor Qm was 65 to 78 and each of the samples 14 and 15 could secure a mechanical quality factor Qm equal to or higher than 60. In other words, it was confirmed that the samples 14 and 15 were practicable even in terms of piezoelectricity.

Samples 17 to 19 were samples in each of which the mixture molar amount x of Ca was 0.1, the mixture molar amount y of Sr was 0.1, the total mixture molar amount (x+y) was 0.2, and in which the mixture molar amount z of $(Zn_{1/2}W_{1/2})$ was 0.03. The firing temperatures of the samples 17 to 19 were 1100, 1150° C., and 1200° C., respectively.

In sample 17, the mixture molar amount z of $(Zn_{1/2}W_{1/2})$ was as low as 0.03 and the degree of sintering decreased. Due to this, sample 17 could not be polarized at the firing temperature of 1100° C.

As for sample 18, the firing temperature was raised to 1150° C. Due to this, a piezoelectric oscillator could be obtained but the electromechanical coupling factor kp was as low as 10% and desired piezoelectricity could not be obtained.

For sample 19, the electromechanical coupling factor kp, the mechanical quality factor Qm, the Curie point Tc, and the temperature rate of change |frTc| of the resonance frequency characteristics were satisfactory. However, the firing temperature was as high as 1200° C. and the object of the present invention to fire the piezoelectric ceramic composition at the low temperature equal to or lower than 1100° C. could not be attained.

Samples 20 to 22 were samples in each of which the mixture molar amount x of Ca was 0.1, the mixture molar amount y of Sr was 0.1, the total mixture molar amount (x+y) was 0.2, and in which the mixture molar amount z of $(Zn_{1/2}W_{1/2})$ differs from those of the other samples.

In sample 22, the mixture molar amount z of $(Zn_{1/2}W_{1/2})$ was excessively 0.15 and the Curie point Tc was, therefore, 250° C., a value lower than 300° C. Due to this, the sample 22 possibly could not resist the reflow heating treatment to be performed on lead-free solder.

On the other hand, the mixture molar amount z of $(Zn_{1/2}W_{1/2})$ for the samples 20 and 21 was 0.04 to 0.1, which amount falls within the scope of the present invention. As a result, it was clear that the Curie point Tc was 305° C. to 310° C. and each of the samples 20 and 21 could secure a Curie point Tc equal to or higher than 300° C. and resist the reflow heating treatment on lead-free solder. Furthermore, the temperature rate of change |frTc| of the resonance frequency was 37 to 40 ppm/° C. and was, therefore, suppressed to be equal to or lower than 80 ppm/° C. Each of the samples 20 and 21 could secure satisfactory temperature characteristics. Besides, the electromechanical coupling factor kp was 44% to 48% and each of the samples 20 and 21 could secure an electromechanical coupling factor kp equal to or higher than 15%. Moreover, the mechanical quality factor Qm was 94 to 115 and each of the samples 20 and 21 could secure a mechanical quality factor Qm equal to or higher than 60. In other words, it was confirmed that the samples 20 and 21 were practicable even in terms of piezoelectricity.

As stated so far, the mixture molar amounts x, Y, (x+y), and z were set to satisfy $0 \leq x \leq 0.2$, $0 \leq y \leq 0.2$, $0.1 \leq (x+y) \leq 0.2$, and $0.04 \leq z \leq 0.1$, respectively, whereby it is possible to fire the piezoelectric ceramic composition at the low temperature equal to or lower than 1100° C., to secure a Curie point Tc equal to or higher than 300° C., and, therefore, to resist the reflow heating treatment on lead-free solder. Besides, the electromechanical coupling factor kp was equal to or higher than 15%, the mechanical quality factor Qm was equal to or higher than 60, and satisfactory piezoelectricity could be secured. Furthermore, the temperature rate of change |frTc| of the resonance frequency could be suppressed to be equal to or lower than 80 ppm/° C. It was clear, therefore, that satisfactory temperature characteristics could be obtained.

EXAMPLE 2

MnCO$_3$ was prepared in addition to the ceramic raw materials described in Example 1.

Next, Pb$_3$O$_4$, CaCO$_3$, SrCO$_3$, TiO$_2$, ZnO, and WO$_6$ were weighed so as to obtain main component composition of $(Pb_{0.8}Ca_{0.1}Sr_{0.1})\{Ti_{0.95}(Zn_{1/2}W_{1/2})_{0.05}\}O_3$. The MnCO$_3$ was weighed so as to have a content shown in Table 3 with respect to 100 weight parts of the main component.

Thereafter, samples 31 to 35 were produced by similar method and procedures to those of Example 1. The firing temperature was set to 1100° C. for all of the samples 31 to 35.

Next, the sintered density, electromechanical coupling factor kp by thickness longitudinal oscillation, mechanical quality factor Qm, Curie point Tc, and temperature rate of change |frTC| of an resonance frequency of each of the samples 31 to 35 were measured by similar method and procedures to those of Example 1.

The Table 3 shows constituent components and firing temperatures of the samples 31 to 35, and Table 4 shows measurement results of the samples 31 to 35. It is to be noted that the Tables 3 and 4 also show sample 15 in which MnCO$_3$ was not added to the main component.

TABLE 3

| Sample No. | $(Pb_{0.8}Ca_{0.1}Sr_{0.1})\{Ti_{0.95}(Zn_{1/2}W_{1/2})_{0.05}\}O_3$ MnCO$_3$ (weight part) | Firing temperature (° C.) |
|---|---|---|
| 15 | 0 | 1100 |
| 31 | 0.05 | 1100 |
| 32 | 0.1 | 1100 |
| 33 | 0.5 | 1100 |
| 34 | 1.0 | 1100 |
| 35** | 1.1 | 1100 |

**indicates out of range of the present invention

TABLE 4

| Sample No. | Sintered density (g/cm³) | Electro-mechanical coupling factor kp (%) | Mechanical quality factor Qm (—) | Curie point Tc (° C.) | Temperature rate of change \|frTC\| of resonance frequency (ppm/° C.) |
|---|---|---|---|---|---|
| 15 | 6.8 | 46 | 78 | 310 | 38 |
| 31 | 6.8 | 44 | 310 | 310 | 38 |
| 32 | 6.8 | 44 | 520 | 310 | 40 |
| 33 | 6.7 | 41 | 580 | 305 | 35 |
| 34 | 6.8 | 39 | 920 | 310 | 38 |
| 35** | 6.8 | 39 | 70 | 300 | 38 |

*indicates out of range of the present invention

As obvious from a comparison of the sample 15 with the samples 31 to 34, the mechanical quality factor Qm greatly improved from 78 to a range from 310 to 920 by adding the Mn component to the main component.

However, as indicated by the sample 35, if the content of MnCO$_3$ exceeds 1.0 weight part with respect to 100 weight parts of the main component, the mechanical quality factor Qm possibly decreases, as compared with the instance of not adding MnCO$_3$ to the main component.

Therefore, if Mn was added to the main components, it was preferable to set the Mn content to fall within a range from 0.05 weight part to 1.0 weight part in terms of MnCO$_3$ with respect to 100 weight parts of the main component. By doing so, it was clear that only the mechanical quality factor kp could be considerably improved without deteriorating the electromechanical coupling factor Qm, the Curie point Tc, and the temperature characteristics of the resonance frequency even if the piezoelectric ceramic element was fired at the low temperature of 1100° C.

The invention claimed is:

1. A piezoelectric ceramic composition comprising a main component having a Curie point of at least 300° C. represented by a general formula of

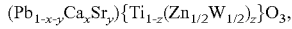
$(Pb_{1-x-y}Ca_xSr_y)\{Ti_{1-z}(Zn_{1/2}W_{1/2})_z\}O_3$, wherein x, y, and z satisfy:

$0 \leq x \leq 0.2$, $0 \leq y \leq 0.2$, $0.1 \leq x+y \leq 0.2$, and $0.04 \leq z \leq 0.1$.

wherein said composition can be fired at a low temperature equal to or lower than 1100° C.

2. The piezoelectric ceramic composition according to claim 1, wherein 0x0.15, and $0 \leq y \leq 0.1$.

3. The piezoelectric ceramic composition according to claim 2, wherein 0.1x0.15, and $0 \leq y \leq 0.1$.

4. The piezoelectric ceramic composition according to claim 3, wherein the piezoelectric ceramic composition contains 0.05 weight part to 1.0 weight part of a Mn component calculated in terms of MnCO$_3$ with respect to 100 weight parts of the main component.

5. The piezoelectric ceramic composition according to claim 2, wherein the piezoelectric ceramic composition contains 0.05 weight part to 1.0 weight part of a Mn component calculated in terms of MnCO$_3$ with respect to 100 weight parts of the main component.

6. The piezoelectric ceramic composition according to claim 1, wherein the piezoelectric ceramic composition contains 0.05 weight part to 1.0 weight part of a Mn component calculated in terms of MnCO$_3$ with respect to 100 weight parts of the main component.

7. A sintered piezoelectric ceramic composition according to claim 6.

8. A sintered piezoelectric ceramic composition according to claim 5.

9. A sintered piezoelectric ceramic composition according to claim 4.

10. A sintered piezoelectric ceramic composition according to claim 3.

11. A sintered piezoelectric ceramic composition according to claim 2.

12. A sintered piezoelectric ceramic composition according to claim 1.

13. A piezoelectric part having an internal electrode buried in a piezoelectric ceramic element and an external electrode on a surface of the piezoelectric ceramic element,
wherein the piezoelectric ceramic element is a sintered piezoelectric ceramic composition according to claim 12.

14. A piezoelectric part having an internal electrode buried in a piezoelectric ceramic element and an external electrode on a surface of the piezoelectric ceramic element,
wherein the piezoelectric ceramic element is a sintered piezoelectric ceramic composition according to claim 11.

15. A piezoelectric part having an internal electrode buried in a piezoelectric ceramic element and an external electrode on a surface of the piezoelectric ceramic element,
wherein the piezoelectric ceramic element is a sintered piezoelectric ceramic composition according to claim 10.

16. A piezoelectric part having an internal electrode buried in a piezoelectric ceramic element and an external electrode on a surface of the piezoelectric ceramic element,
wherein the piezoelectric ceramic element is a sintered piezoelectric ceramic composition according to claim 9.

17. A piezoelectric part having an internal electrode buried in a piezoelectric ceramic element and an external electrode on a surface of the piezoelectric ceramic element,
wherein the piezoelectric ceramic element is a sintered piezoelectric ceramic composition according to claim 8.

18. A piezoelectric part having an internal electrode buried in a piezoelectric ceramic element and an external electrode on a surface of the piezoelectric ceramic element,
wherein the piezoelectric ceramic element is a sintered piezoelectric ceramic composition according to claim 7.

19. A piezoelectric part having an internal electrode buried in a piezoelectric ceramic element and an external electrode on a surface of the piezoelectric ceramic element,
wherein the piezoelectric ceramic element is a sintered piezoelectric ceramic composition according to claim 6.

* * * * *